(12) United States Patent
Chung

(10) Patent No.: US 6,410,344 B1
(45) Date of Patent: Jun. 25, 2002

(54) FERROELECTRIC RANDOM ACCESS MEMORY DEVICE AND METHOD FOR THE MANUFACTURE THEREOF

(75) Inventor: Choong-Heui Chung, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/735,945

(22) Filed: Dec. 14, 2000

(30) Foreign Application Priority Data

Dec. 28, 1999 (KR) .......................................... 99-63777

(51) Int. Cl.⁷ .............................................. H01L 21/00
(52) U.S. Cl. .......................... 438/3; 438/239; 438/253; 257/295
(58) Field of Search ............................ 438/3, 238, 239, 438/386, 399, 250, 393, 244, 253, 387, 396; 257/296, 297, 300, 306, 295

(56) References Cited

U.S. PATENT DOCUMENTS

| | | | | |
|---|---|---|---|---|
| 6,043,561 A | * | 3/2000 | Katori et al. | 257/751 |
| 6,204,070 B1 | * | 3/2001 | Kim | 438/3 |
| 6,232,133 B1 | * | 5/2001 | Kim et al. | 438/3 |
| 6,300,144 B1 | * | 10/2001 | Wouters et al. | 438/3 |
| 6,315,913 B1 | * | 11/2001 | Engelhardt et al. | 216/13 |

* cited by examiner

Primary Examiner—Tom Thomas
Assistant Examiner—Douglas W. Owens
(74) Attorney, Agent, or Firm—Jacobson Holman, PLLC

(57) ABSTRACT

A ferroelectric random access memory (FeRAM) device including an active matrix provided with a transistor and diffusion regions, a first capacitor structure formed on a portion of the active matrix and provided with a first capacitor thin film made of strontium bismuth tantalate (SBT), a second capacitor structure formed on a remaining portion of the active matrix and provided with a second capacitor thin film made of lead zirconate titanate (PZT), and a metal interconnection formed on the first and the second capacitor structures, thereby electrically connecting the first and the second capacitor structures to one of the diffusion regions.

5 Claims, 6 Drawing Sheets

FERROELECTRIC RANDOM ACCESS MEMORY DEVICE AND METHOD FOR THE MANUFACTURE THEREOF

FIELD OF THE INVENTION

The present invention relates to a ferroelectric random access memory (FeRAM) device; and, more particularly, to a FeRAM device that employs two capacitors with strontium bismuth tantalate (SBT) and lead zirconate titanate (PZT) as capacitor thin films and a method for manufacturing the same.

DESCRIPTION OF THE PRIOR ART

With the recent progress of film deposition techniques, applications of a nonvolatile memory cell using a ferroelectric thin film have increasingly been developed. This nonvolatile memory cell is a high-speed rewritable nonvolatile memory cell utilizing the high-speed polarization/inversion and the residual polarization of the ferroelectric capacitor thin film.

Therefore, a ferroelectric random access memory (FeRAM) where a capacitor thin film with ferroelectric properties such as strontium bismuth tantalate (SBT) and lead zirconate titanate (PZT) is increasingly used for a capacitor thin film in place of a conventional silicon oxide film or a silicon nitride film, because it assures a low-voltage and high-speed performance, and further, does not require periodic refresh to prevent loss of information during standby intervals like a dynamic random access memory (DRAM).

Since a ferroelectric material has a dielectric constant ranging from hundreds to thousands value and stabilized residual polarization property at room temperature, it is being applied to the non-volatile memory device as the capacitor thin film. In the case of employing the ferroelectric capacitor thin film in the non-volatile memory device, information data are stored by polarization of dipoles when an electric field is applied thereto. Even if the electric field is removed, the residual polarization remains so that one of information data, i.e., "0" or "1", can be stored.

Referring to FIG. 1, there are provided hysterisis loop curves of an applied voltage versus polarization. As shown, if the SBT is used as a capacitor thin film as denoted "A", there is a drawback that the memory device is hardly operated stably, even though it can be operated at low voltage due to a decrease of $V_c$ value.

Meanwhile, if the PZT is used as the capacitor thin film as represented "B", there is also another drawback that the residual polarization is not only increased but $V_c$ is also increased, whereby it cannot be operated at low voltage.

SUMMARY OF THE INVENTION

It is, therefore, an object of the present invention to provide a a ferroelectric random access memory (FeRAM) device including two capacitors, wherein one capacitor has strontium bismuth tantalate (SBT) as a capacitor thin film and the other has lead zirconate titanate (PZT) as the capacitor thin film.

It is another object of the present invention to provide a method for manufacturing the FeRAM device including two capacitors, wherein one capacitor has SBT as a capacitor thin film and the other has PZT as the capacitor thin film.

In accordance with one aspect of the present invention, there is provided a FeRAM device, comprising: an active matrix provided with a transistor and diffusion regions; a first capacitor structure, formed on a portion of the active matrix, provided with a first capacitor thin film made of strontium bismuth tantalate (SBT); a second capacitor structure, formed on a remaining portion of the active matrix, provided with a second capacitor thin film made of lead zirconate titanate (PZT); and a metal interconnection formed on the first and the second capacitor structures, thereby electrically connecting the first and second capacitors to one of the diffusion regions.

In accordance with another aspect of the present invention, there is provided a method for manufacturing a FeRAM device, the method comprising the steps of: a) preparing an active matrix provided with a transistor and diffusion regions; b) forming a first capacitor structure on a portion of the active matrix, provided with a first capacitor thin film made of SBT; c) forming a second capacitor structure on a remaining portion of the active matrix, provided with a second capacitor thin film made of PZT; and d) forming a metal interconnection on the first and the second capacitor structures, thereby electrically connecting the first and the second capacitor structures to one of the diffusion regions.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
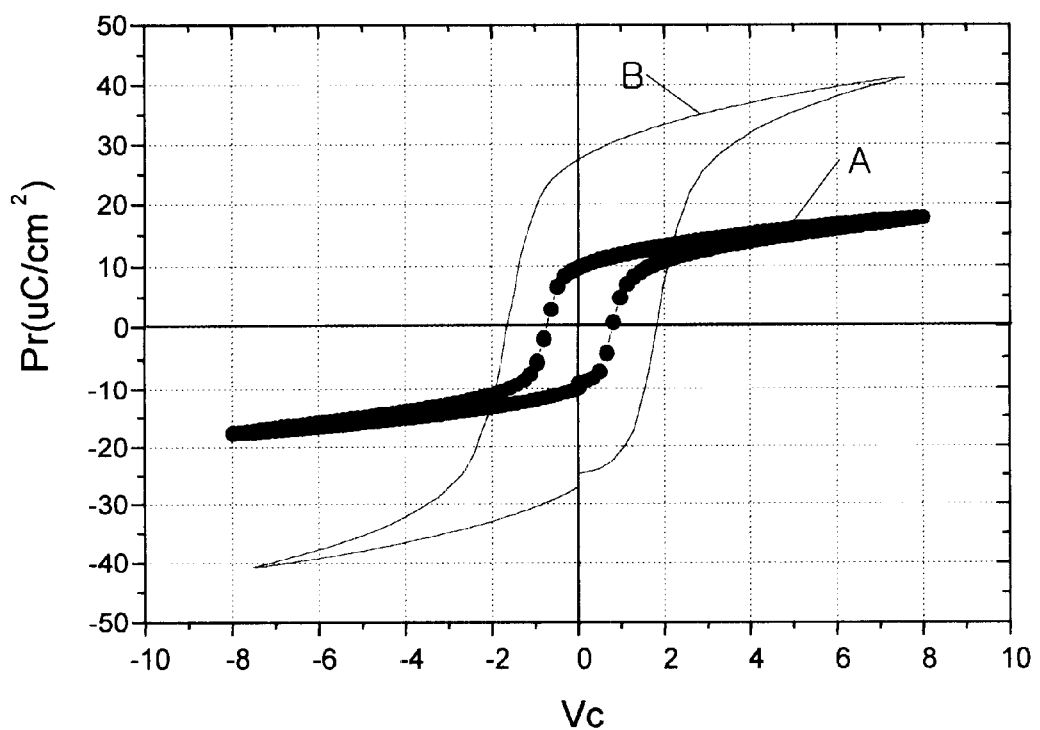
FIG. 1 is a graph of hysterisis loop curves of conventional strontium bismuth tantalate (SBT) and lead zirconate titanate (PZT) capacitor thin films.

There are provided in FIG. 2 and FIGS. 3A to 3G cross sectional views of a ferroelectric random access memory (FeRAM) device 100 for use in a memory cell and cross sectional views setting forth a method for the manufacture thereof in accordance with a preferred embodiment of the present invention. It should be noted that like parts appearing in FIG. 2 and FIGS. 3A to 3G are represented by like reference numerals.

Figure 2:
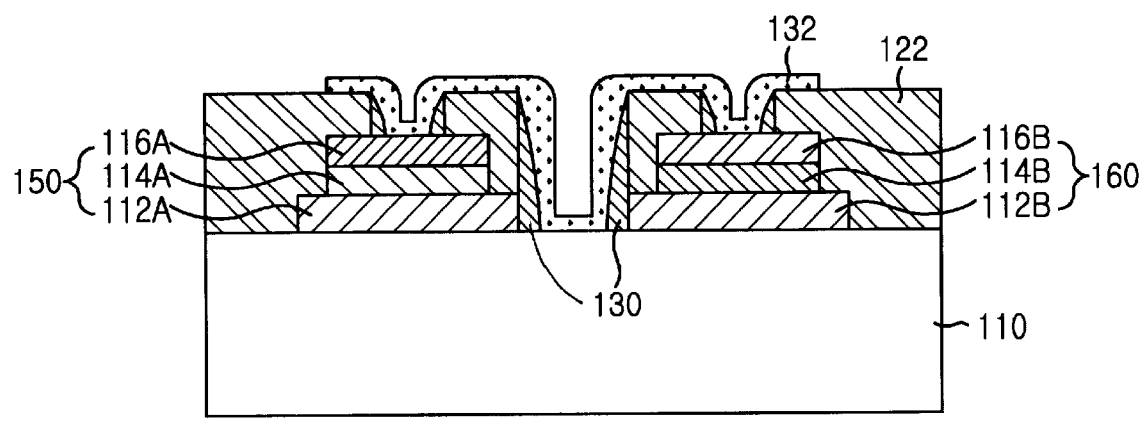
FIG. 2 is a cross sectional view of a ferroelectric random access memory (FeRAM) device provided with two capacitor structures in accordance with a preferred embodiment of the present invention.

In FIG. 2, there is provided a cross sectional view of the inventive FeRAM device 100 comprising an active matrix 110; a first capacitor structure 150 provided with a first top electrode 116A, a first capacitor thin film 114A and a first bottom electrode 112A; a second capacitor structure 160 provided with a second top electrode 116B, a second capacitor thin film 114B and a second bottom electrode 112B; an insulating layer 122 and a metal interconnection 132. Here, a reference numeral 130 denotes spacers, made of an insulating material, for preventing a short between top electrodes and bottom electrodes.

In the FeRAM device 100, the first capacitor thin film 114A is made of strontium bismuth tantalate (SBT) and the second capacitor thin film 114B is made of lead zirconate titanate (PZT). In addition, the capacitor thin films 114A, 114B are formed with a thickness ranging from 150 nm to 200 nm by using a method such as a sol-gel technique, a chemical vapor deposition (CVD) technique and a physical vapor deposition (PVD) technique. The first and the second electrodes 116A, 112A, 116B, 112B are made of a material such as platinum (Pt), a metal oxide or the like.

FIGS. 3A to 3F are schematic cross sectional views setting forth the method for manufacture of a semiconductor memory device 100 in accordance with the preferred embodiment of the present invention.

The process for manufacturing the semiconductor device 100 begins with the deposition of a first conductive layer on top of the active matrix 110, and then patterned into a first predetermined configuration, thereby obtaining first and second bottom electrodes 112A, 112B. The bottom electrodes 112A, 112B are made of a material such as platinum (Pt), metal oxide or the like. Thereafter, a first dielectric layer 114 followed by a second conductive layer 116 are deposited on an entire surface of the bottom electrodes 112A, 112B and the active matrix 110. The first dielectric layer 114 is formed with a thickness ranging from 150 nm to 200 nm by using a method such as a sol-gel technique, CVD or PVD techniques, with the first dielectric layer being made of SBT. The second conductive layer 116 is made of a material such as Pt, a metal oxide or the like.

Figure 3A:
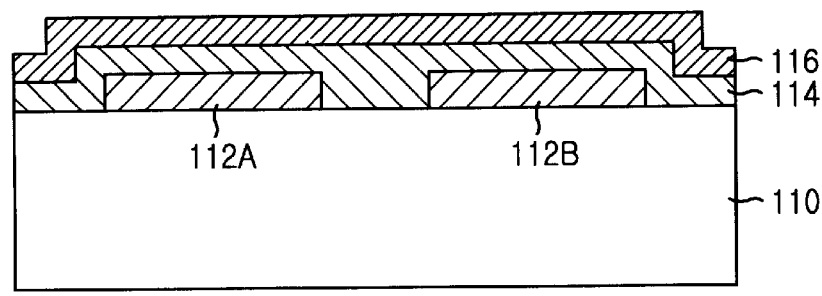
FIGS. 3A to 3G are cross sectional views setting forth a method for the FeRAM device in accordance with the present invention.
Figure 3B:
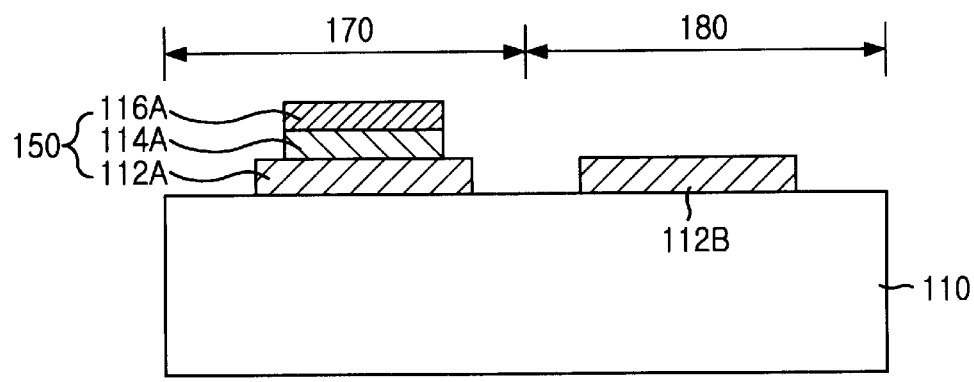

In a next step as shown in FIG. 3B, the second conductive layer 116 and the first dielectric layer 114 are selectively patterned into a second predetermined configuration in a first region 170, thereby obtaining a first capacitor structure 150 provided with the first bottom electrode 112A, a first capacitor thin film 114A of SBT and a first top electrode 116A. Meanwhile, in a second region 180, the first dielectric and second conductive layers 114, 116 are completely removed.

Figure 3C:
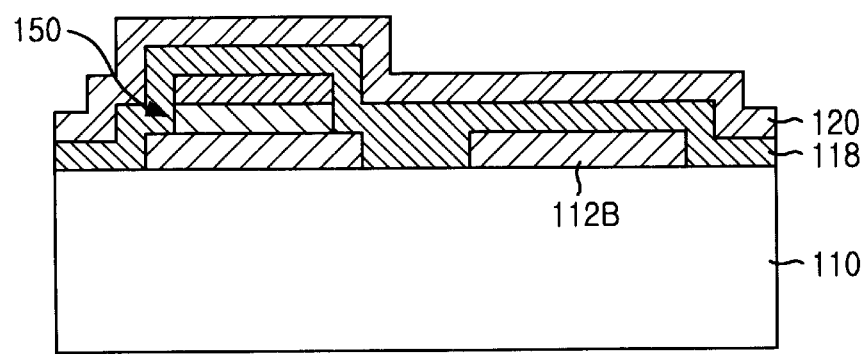

In a subsequent step as shown in FIG. 3C, a second dielectric layer 118 followed by a third conductive layer 120 are formed on the entire surface, with the second dielectric layer 118 being made of PZT and the third conductive layer 120 being made of a material such as Pt, a metal oxide or the like.

Figure 3D:
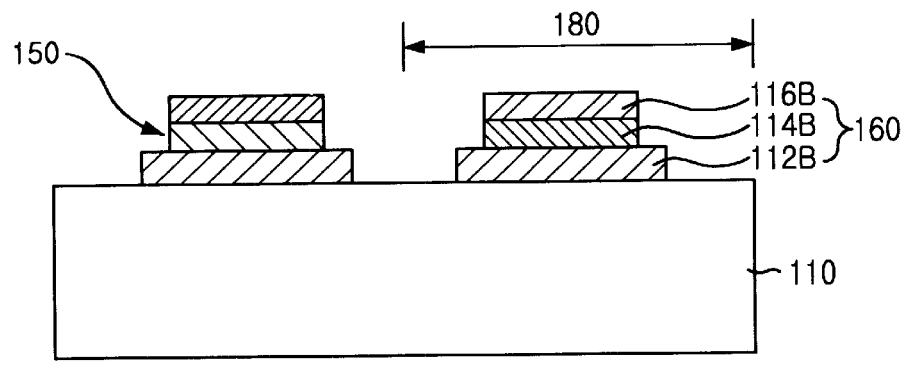

Thereafter, as shown in FIG. 3D, the third conductive layer 120 and the second dielectric layer 118 are selectively patterned into a third predetermined configuration in the second region 180, thereby obtaining a second capacitor structure 160 provided with the bottom electrode 112B, a second capacitor thin film 1142 and a second top electrode 116B. Meanwhile, in the first region 170 in which the SBT capacitor structure 150 has already been formed, the second dielectric layer 118 and the third conductive layer 120 are completely removed.

Figure 3E:
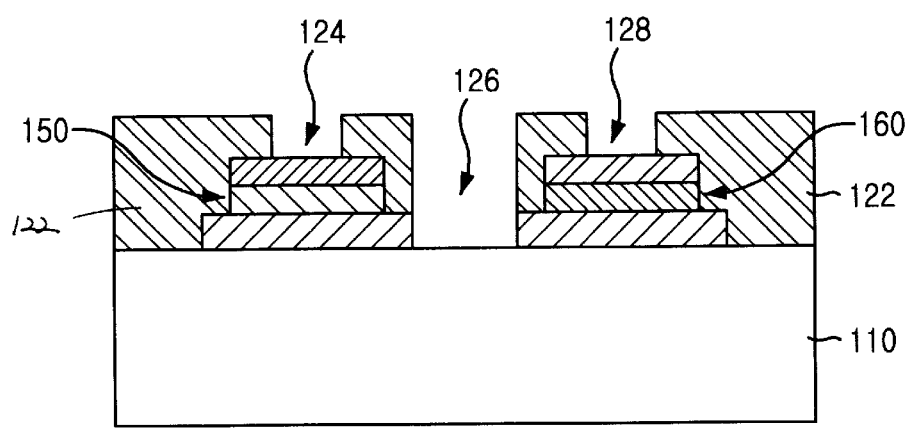

In an ensuing step as shown in FIG. 3E, a first insulating layer 122 is formed on an entire surface including the first capacitor structure 150, the second capacitor structure 160 and the active matrix 110, and then patterned into a fourth predetermined configuration, thereby obtaining a first opening 124, a second opening 126, and a third openings 128. Here, after depositing the first insulating layer, an annealing process is carried out at approximately 800° C. for relieving the residual stress produced between the capacitor thin films 114A, 114B and the first insulating layers 122.

Figure 3F:
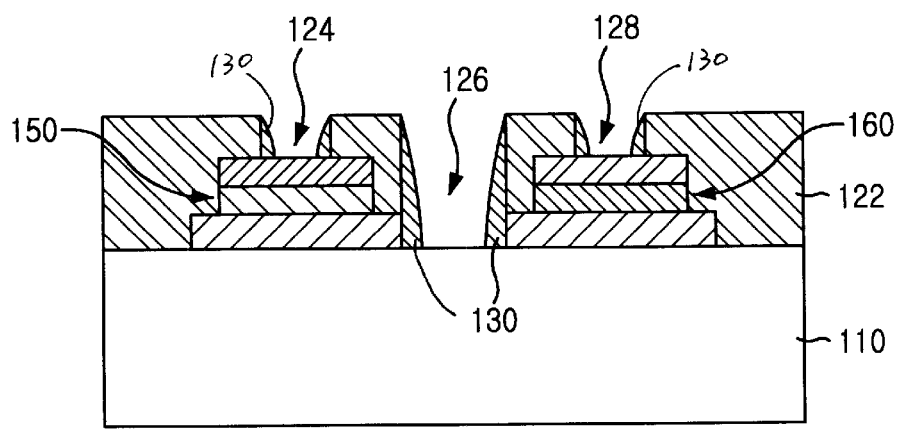

In a next step as shown in FIG. 3F, a second insulating layer is formed on an entire surface including the first insulating layer 122 and the openings 124, 126, 128, and then patterned into a fifth predetermined configuration by using a method such as a dry etching, thereby obtaining spacers 130 in the openings 124, 126, 128 to prevent a short between the first top electrode 116A and the first bottom electrode 112A, and between the second top electrode 116B and the second bottom electrode 112B.

Figure 3G:
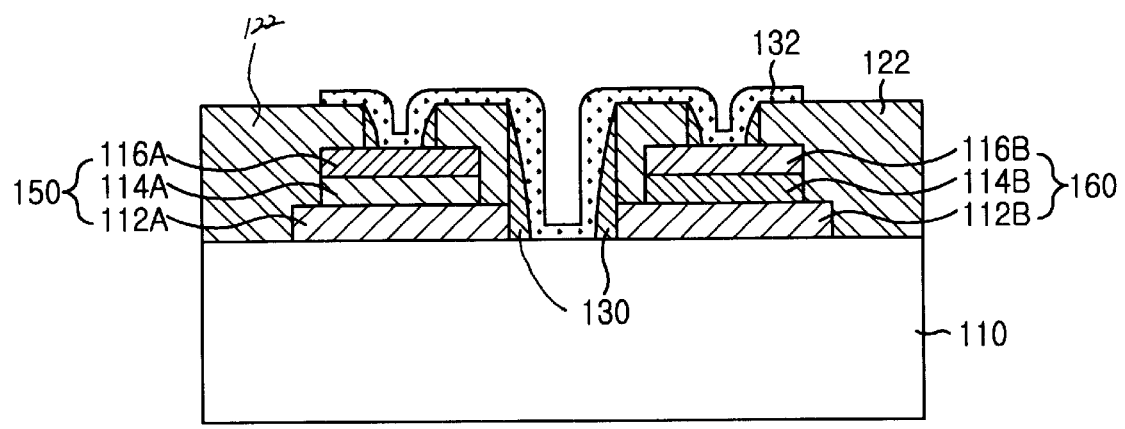

Finally, as shown in FIG. 3G, a fourth conductive layer is formed on an entire surface and then, patterned into a sixth predetermined configuration, thereby obtaining a metal interconnection 132 to connect the first top electrode 116A of the first capacitor structure 150 and a drain region (not shown), and the second top electrode 116B of the second capacitor structure 160 and the drain region (not shown).

Figure 4:
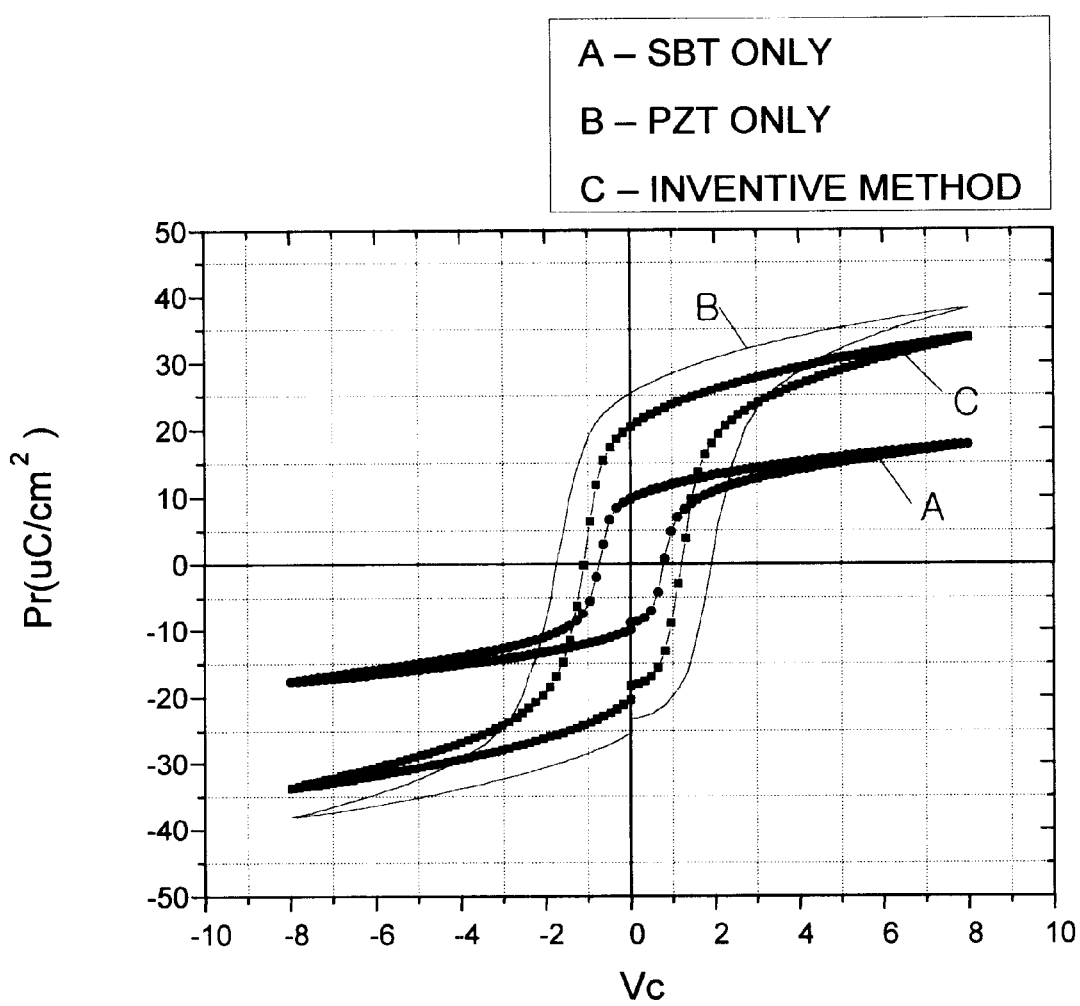
FIG. 4 is a graph of hysterisis loop curves of the FeRAM device of the present invention in comparison with the conventional curves.

Referring to FIG. 4, there is shown a graph comparing a hysterisis loop curve of the semiconductor device 100 in accordance with the present invention and those of prior art constructions. In comparison with the prior art which employs SBT or PZT as the capacitor thin film, it is understood that the present invention provides a low $V_c$ value, i.e., operable at low voltage, due to employing SBT as the first capacitor thin film and further, a higher residual polarization characteristic due to employing PZT as the second capacitor thin film.

While the present invention has been described with respect to the particular embodiments, it will be apparent to those skilled in the art that various changes and modifications may be made without departing from the scope of the invention as defined in the following claims.

What is claimed is:

1. A method for manufacturing a FeRAM device, the method comprising the steps of:

a) preparing an active matrix provided with a transistor and diffusion regions;

b) forming a first capacitor structure on a portion of the active matrix, provided with a first capacitor thin film made of SBT;

c) forming a second capacitor structure on a remaining portion of the active matrix, provided with a second capacitor thin film thereof made of PZT; and d) forming a metal interconnection on the first and the second capacitor structures, thereby electrically connecting the first and the second capacitor structures to one of the diffusion regions.

2. The method as recited in claim 1, wherein the first capacitor structure includes a first top electrode and a first bottom electrode, and the second capacitor structure includes a second top electrode and a second bottom electrode.

3. The method as recited in claim 2, wherein the electrodes are made of a material selected from a group consisting of platinum and a metal oxide.

4. The method as recited in claim 1, wherein the first and the second capacitor thin films are each formed with a thickness ranging from 150 nm to 200 nm by using a method selected from a group consisting of a sol-gel technique, a CVD technique and a PVD technique.

5. The method as recited in claim 1 after the step c), further comprising the steps of:

e) forming an insulating layer on the first and the second capacitor structure and the active matrix;

f) patterning the insulating layer into a predetermined configuration to obtain contact holes;

g) annealing the device at approximately 800° C. for relieving stress produced between the capacitor structures and the insulating layer; and h) forming spacers on sides of the contact holes.

* * * * *